(12) United States Patent
Kogure et al.

(10) Patent No.: US 10,177,807 B2
(45) Date of Patent: Jan. 8, 2019

(54) COMMUNICATION MODULE

(71) Applicant: Murata Manufacturing Co., Ltd., Kyoto (JP)

(72) Inventors: Takeshi Kogure, Kyoto (JP); Yuji Takematsu, Kyoto (JP); Katsunari Nakazawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/850,211

(22) Filed: Dec. 21, 2017

(65) Prior Publication Data
US 2018/0183483 A1 Jun. 28, 2018

(30) Foreign Application Priority Data

Dec. 22, 2016 (JP) ................................. 2016-249258

(51) Int. Cl.
*H04B 1/40* (2015.01)
*H04B 10/2581* (2013.01)
(Continued)

(52) U.S. Cl.
CPC ............... *H04B 1/40* (2013.01); *H03F 3/195* (2013.01); *H03F 3/213* (2013.01); *H03H 7/38* (2013.01);
(Continued)

(58) Field of Classification Search
CPC .......... H04B 1/10; H04B 7/02; H04B 1/0483; H04B 7/024; H04B 10/2581; H04M 1/76;
(Continued)

(56) References Cited

U.S. PATENT DOCUMENTS 9,288,031 B2 * 3/2016 Rousu .................... H04B 1/006
9,819,310 B2 * 11/2017 Wu ........................ H03F 1/0216
(Continued)

FOREIGN PATENT DOCUMENTS

JP H09-284061 A 10/1997

OTHER PUBLICATIONS

C. Huynh et. al "New Technique for Synthesizing Concurrent Dual-Band Impedance-Matching Filtering Networks and 0.18-um SiGe BiCMOS 25.5/37-GHz Concurrent Dual Band Power Amplifier," IEEE Transactions on Microwave Theory and Techniques, Nov. 2013, pp. 3927-3939, vol. 61, No. 11. IEEE.

*Primary Examiner* — Andrew Wendell
(74) *Attorney, Agent, or Firm* — Pearne & Gordon LLP

(57) ABSTRACT

A communication module includes a power amplifier that amplifies a transmission signal having a first communication system or a second communication system and outputs an amplified signal to a signal path, a switch circuit that switches between a signal path for the first communication system and a signal path for the second communication system and outputs the amplified signal to one of the signal paths for the first communication system and the second communication system in accordance with a control signal supplied in accordance with the communication system of the transmission signal, and an impedance-matching network disposed between the power amplifier and the switch circuit, the impedance-matching network including a first variable capacitance element. The first variable capacitance element has a capacitance value that is controlled in accordance with the communication system of the transmission signal.

8 Claims, 9 Drawing Sheets

(51) Int. Cl.
  *H04M 1/76* (2006.01)
  *H03F 3/213* (2006.01)
  *H03F 3/195* (2006.01)
  *H03H 7/38* (2006.01)
(52) U.S. Cl.
  CPC .. *H03F 2200/387* (2013.01); *H03F 2200/451* (2013.01)
(58) Field of Classification Search
  CPC ........... H03H 7/38; H03F 3/213; H03F 3/195; H03F 2200/387; H03F 2200/451
  See application file for complete search history.

(56) References Cited

U.S. PATENT DOCUMENTS

| | | | |
|---|---|---|---|
| 2003/0032396 A1* | 2/2003 | Tsuchiya | H03F 1/02 455/127.1 |
| 2004/0248529 A1* | 12/2004 | Park | H04B 1/48 455/127.1 |
| 2004/0251984 A1* | 12/2004 | Javor | H03F 1/56 333/32 |
| 2008/0284539 A1* | 11/2008 | Tateoka | H03F 1/56 333/124 |
| 2009/0185325 A1* | 7/2009 | Park | H01G 5/18 361/277 |
| 2011/0086600 A1* | 4/2011 | Muhammad | H04B 1/0458 455/120 |
| 2012/0013401 A1* | 1/2012 | Jeon | H03F 1/02 330/192 |
| 2016/0080012 A1 | 3/2016 | Sun et al. | |
| 2016/0112009 A1 | 4/2016 | Hitomi et al. | |
| 2016/0241207 A1 | 8/2016 | Lehtola | |
| 2017/0063413 A1 | 3/2017 | Ripley et al. | |
| 2017/0346516 A1 | 11/2017 | Ripley et al. | |

\* cited by examiner

Freq(699MHz to 915MHz)

COMMUNICATION MODULE

This application claims priority from Japanese Patent Application No. 2016-249258 filed on Dec. 22, 2016. The content of this application is incorporated herein by reference in its entirety.

BACKGROUND OF THE DISCLOSURE

Field of the Disclosure

The present disclosure relates to a communication module.

Description of the Related Art

A mobile communication device such as a cellular phone includes a power amplifier device to amplify a transmission signal. For example, Japanese Unexamined Patent Application Publication No. 9-284061 discloses a power amplifier device including a variable impedance transformation circuit subsequent to a power amplifier. The variable impedance transformation circuit includes switch circuits that are controlled in accordance with the output level of a transmission signal, and capacitors connected in series with the switch circuits. This configuration enables the input impedance of the variable impedance transformation circuit, viewed from the power amplifier, to be controlled and improves power efficiency.

Recent communication modules incorporated in devices such as cellular phones and including power amplifiers are required to support a plurality of communication systems (multiple modes) such as second-generation mobile communication systems (2G), third-generation mobile communication systems (3G), and fourth-generation mobile communication systems (4G) and to handle signals in a plurality of frequency bands (multiple bands) used for each of these communication systems. The configuration disclosed in Japanese Unexamined Patent Application Publication No. 9-284061 needs to include a number of power amplifiers corresponding to the number of communication systems or the number of frequency bands, which leads to an increase in circuit scale.

BRIEF SUMMARY OF THE DISCLOSURE

Accordingly, it is an object of the present disclosure to provide a communication module that supports a plurality of communication systems while suppressing an increase in circuit scale.

A communication module according to preferred embodiments of the present disclosure includes a power amplifier that amplifies a transmission signal having a first communication system or a second communication system and outputs an amplified signal to a signal path, a switch circuit that switches between a signal path for the first communication system and a signal path for the second communication system and outputs the amplified signal to one of the signal paths for the first communication system and the second communication system in accordance with a control signal supplied in accordance with the communication system of the transmission signal, and an impedance-matching network disposed between the power amplifier and the switch circuit. The impedance-matching network includes a first variable capacitance element. The first variable capacitance element has a capacitance value that is controlled in accordance with the communication system of the transmission signal.

According to preferred embodiments of the present disclosure, it is possible to provide a communication module that supports a plurality of communication systems while suppressing an increase in circuit scale.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Embodiments of the present disclosure will be described in detail hereinafter with reference to the drawings. The same or substantially the same elements are identified with the same numerals and are not described again.

Figure 1:
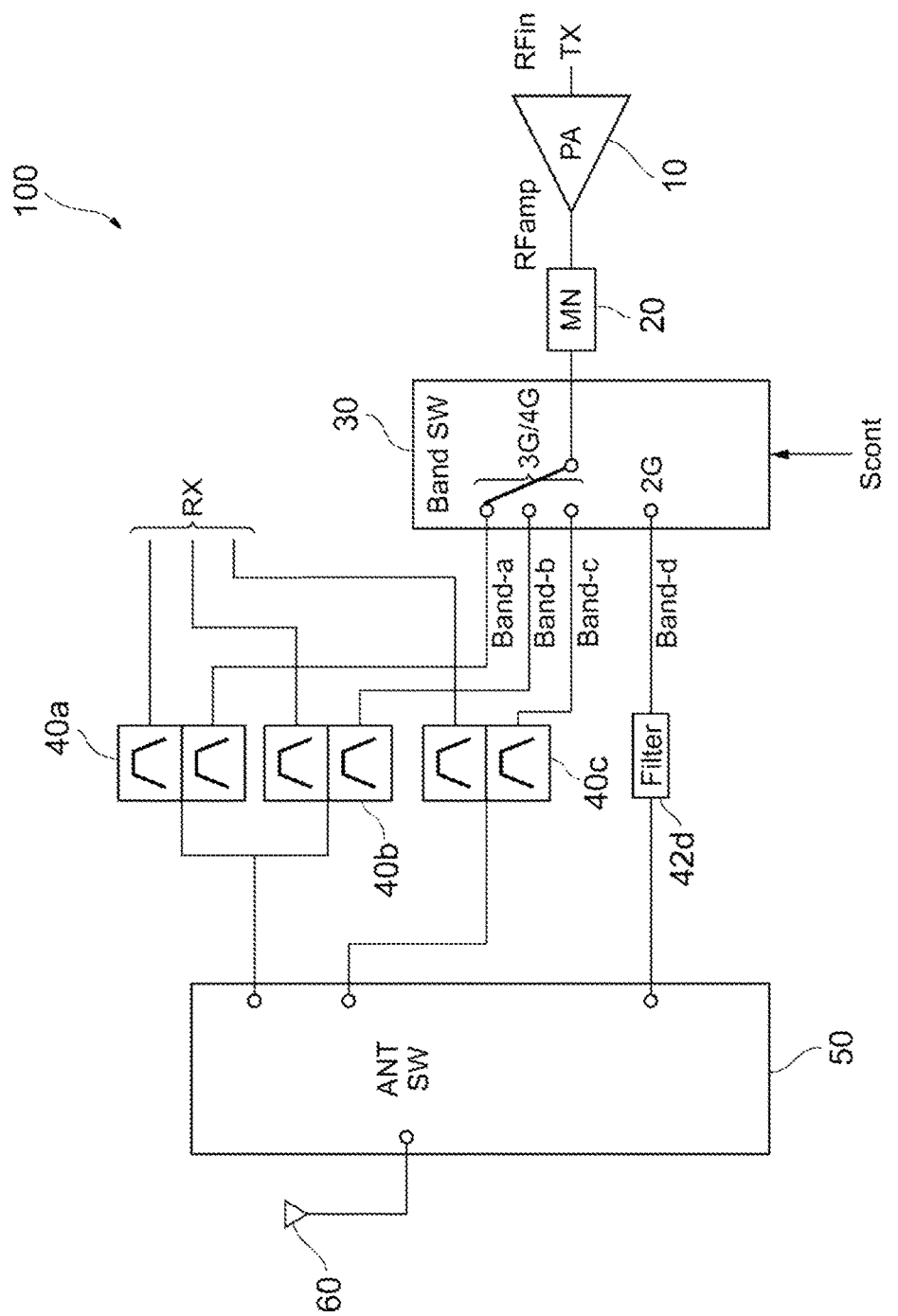
FIG. 1 illustrates an example configuration of a communication module according to a first embodiment of the present disclosure.

FIG. 1 illustrates an example configuration of a communication module 100 according to a first embodiment of the present disclosure. The communication module 100 is included in, for example, a mobile communication device such as a cellular phone and is used to transmit and receive various signals such as audio or data signals to and from a base station. The communication module 100 supports a plurality of frequency bands (multi-band) of radio frequencies (RFs). The communication module 100 also supports a plurality of communication systems (multi-mode) such as second-generation mobile communication systems (2G), third-generation mobile communication systems (3G), and fourth-generation mobile communication systems (4G). The communication systems supported by the communication module 100 are not limited to those described above, and the communication module 100 may support other mobile communication systems, for example, fifth-generation mobile communication systems (5G). The communication module 100 may support carrier aggregation.

As illustrated in FIG. 1, the communication module 100 includes a power amplifier (PA) 10, a matching network (MN) 20, a band switch 30, duplexers 40a, 40b, and 40c, a filter circuit 42d, an antenna switch 50, and an antenna 60. The communication module 100 illustrated in FIG. 1 includes, for example, signal paths associated with three bands Band-a, Band-b, and Band-c for 3G or 4G (3G/4G) (first communication system) and a signal path associated with a single band Band-d for 2G (second communication system). The numbers of bands described above are examples, and any other number of bands may be used for each of 2G and 3G/4G.

The power amplifier 10 amplifies the power of an input transmission signal RFin to a level necessary to transmit the transmission signal RFin to a base station, and outputs an amplified signal RFamp. In this embodiment, transmission signals of the three bands Band-a, Band-b, and Band-c for 3G/4G and the single band Band-d for 2G are amplified by the same power amplifier 10. The power amplifier 10 may be, for example, but not limited to, a bipolar transistor such as a heterojunction bipolar transistor (HBT) or a field effect transistor such as a metal-oxide-semiconductor field effect transistor (MOSFET). The number of power amplifier stages that form the power amplifier 10 is not limited in particular, and the power amplifier 10 may be formed by two or more power amplifier stages.

The matching network 20 (impedance-matching network) is disposed between the power amplifier 10 and the band switch 30 and is configured to match the impedances of the power amplifier 10 and the band switch 30. Specifically, the output impedance at an output terminal of the power amplifier 10 is, for example, about several ohms ($\Omega$), and the input impedance of the antenna 60 is about several tens of ohms ($\Omega$) (for example, about 50$\Omega$). Thus, the matching network 20 transforms the output impedance at the output terminal of the power amplifier 10 to about several tens of ohms ($\Omega$). The detailed configuration of the matching network 20 will be described below.

The band switch 30 (switch circuit) is supplied with a control signal Scont for the mode and band of the input amplified signal RFamp from an external unit. In accordance with the control signal Scont, the band switch 30 switches between the 2G and 3G/4G signal paths and outputs the amplified signal RFamp to the corresponding signal path.

The duplexers 40a, 40b, and 40c are disposed in the 3G/4G signal paths subsequent to the band switch 30 and are respectively associated with the bands Band-a, Band-b, and Band-c. For example, the duplexer 40a outputs a 3G/4G transmission signal supplied from the band switch 30 to the antenna switch 50. The duplexer 40a also outputs a 3G/4G received signal supplied from the antenna switch 50 to a receiving circuit. The receiving circuit is not described herein. The duplexer 40a is constituted by, for example, a low-pass filter (LPF), a band pass filter (BPF), or the like that allows fundamentals of receive frequencies or transmit frequencies in the band Band-a to pass therethrough and that attenuates the harmonics. The duplexers 40b and 40c are similar to the duplexer 40a and are not described in detail herein. Signal paths from the duplexers 40a, 40b, and 40c to the antenna switch 50 may be a single shared signal path for different bands, such as a signal path from the duplexers 40a and 40b to the antenna switch 50, or may be signal paths specific to the respective bands, such as a signal path from the duplexer 40c to the antenna switch 50.

The filter circuit 42d is disposed in the 2G signal path subsequent to the band switch 30 and is associated with the band Band-d. The filter circuit 42d outputs a 2G transmission signal supplied from the band switch 30 to the antenna switch 50. The filter circuit 42d may be a notch filter, for example.

The antenna switch 50 switches between the signal paths and outputs an input transmission signal or received signal to the corresponding signal path in accordance with the mode and band of the input signal. The antenna 60 transmits and receives a transmission signal or a received signal between the mobile terminal and the base station.

In the communication module 100, for example, the constituent elements disposed from the power amplifier 10 to the antenna switch 50 may be mounted on the same module, and the antenna 60 may be formed on a separate substrate. The output impedance of the power amplifier 10 will be described with reference to FIGS. 2A and 2B.

Figure 2A:
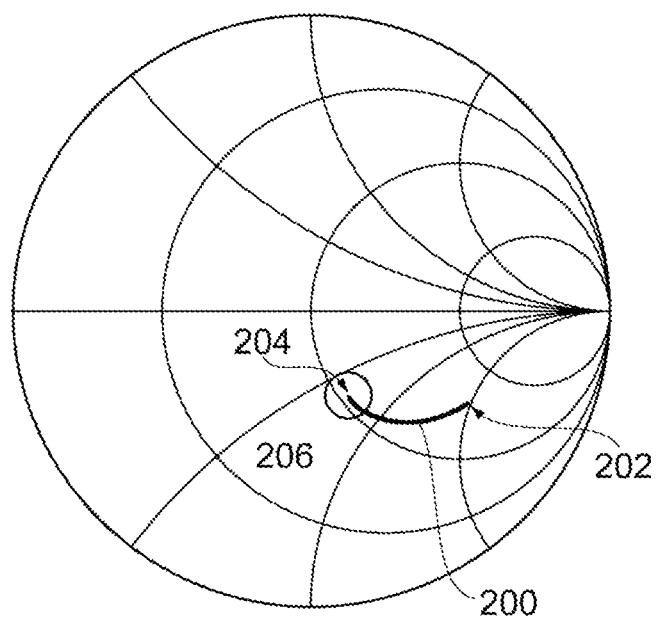
FIG. 2A illustrates an output impedance locus of a power amplifier in the communication module according to the first embodiment of the present disclosure.
Figure 2B:
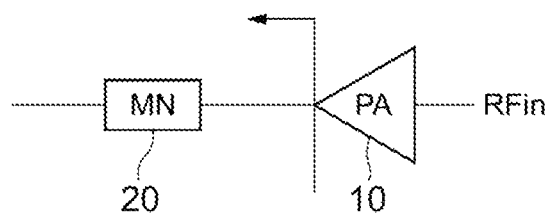
FIG. 2B is a diagram used for describing a Smith chart illustrated in FIG. 2A.

FIG. 2A illustrates an output impedance locus of a power amplifier in a communication module according to the first embodiment of the present disclosure, and FIG. 2B is a diagram used for describing a Smith chart illustrated in FIG. 2A. FIG. 2A illustrates an output impedance locus 200 of the power amplifier 10 in the communication module 100 illustrated in FIG. 1 when the frequency of the transmission signal is changed from 699 MHz (corresponding to the 3G/4G very low band) to 915 MHz (corresponding to the 2G band or the 3G/4G low band) with the assumption that the element constants of the matching network 20 are constant. The Smith chart illustrated in FIG. 2A is normalized to the desired output impedance of the power amplifier 10, with a point 202 corresponding to 699 MHz, a point 204 corresponding to 915 MHz, and a circle 206 representing target values of the output impedance of the power amplifier 10. The locus 200 is obtained when the constituent elements up to the matching network 20 are taken into account, as illustrated in FIG. 2B, and no consideration is given to the constituent elements (for example, duplexers) subsequent to the matching network 20.

As illustrated in FIG. 2A, the output impedance of the power amplifier 10 has frequency characteristics. For example, the point 204 is included in the circle 206 representing the target values, but the point 202 is not included in the circle 206. That is, under the condition described above, the power amplifier 10 achieves the desired characteristics for a 2G signal and a 3G/4G low band signal, but does not achieve the desired characteristics for a 3G/4G very low band signal since the output impedance drifts from the target values. Thus, the communication module 100 would need to include a plurality of power amplifiers suitable for the respective bands, assuming that the element constants of the matching network 20 are constant. In this embodiment, the element constants of the matching network 20 are controlled in accordance with the mode and band of a signal, which enables the output impedance of the power amplifier 10 to be shifted to make it close to the target values. The detailed configuration of the matching network 20 will now be described.

Figure 3:
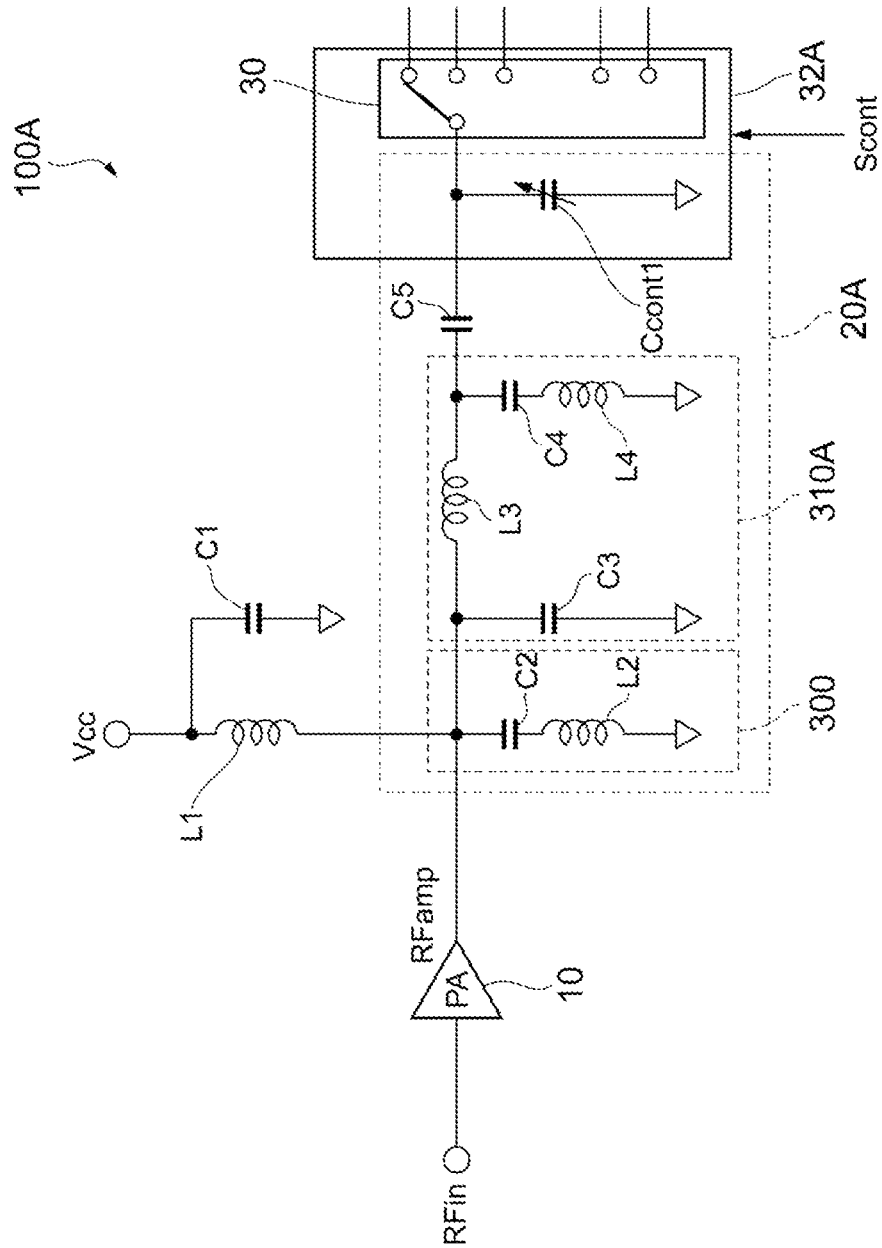
FIG. 3 illustrates an example configuration of a matching network in the communication module according to the first embodiment of the present disclosure.

FIG. 3 illustrates an example configuration of a matching network in a communication module according to the first embodiment of the present disclosure. A communication module 100A illustrated in FIG. 3 includes a power amplifier 10, a matching network 20A, a band switch 30, an inductor L1, and a capacitance element C1. In FIG. 3, among the elements of the communication module 100A, only the elements related to the power amplifier 10, the matching network 20A, and the band switch 30 are illustrated, whereas other elements are not illustrated. The same or substantially the same elements as those of the communication module 100 are identified with the same numerals and are not described.

A power supply voltage Vcc is supplied to an end of the inductor L1, and the other end of the inductor L1 is connected to the output terminal of the power amplifier 10. The inductor L1 is a choke inductor for preventing the transmission signal RFin from leaking to a power supply circuit. The capacitance element C1 is a decoupling capacitor for stabilizing the power supply voltage Vcc.

The matching network 20A includes inductors L2, L3, and L4, capacitance elements C2, C3, C4, and C5, and a variable capacitance element Ccont1.

The capacitance element C2 and the inductor L2 form an inductor-capacitor (LC) series resonant circuit 300. Specifically, the capacitance element C2 and the inductor L2 are connected in series in such a manner that an end of the capacitance element C2 is connected to the output terminal of the power amplifier 10 and an end of the inductor L2 is grounded. The constants of the elements of the LC series resonant circuit 300 are determined such that the LC series resonant circuit has a resonant frequency equal to the frequency of a harmonic (such as the second or third harmonic) of the transmission signal RFin. In the LC series resonant circuit 300, accordingly, the harmonic of the transmission signal RFin is short-circuited, which may prevent or minimize the occurrence of noise. The communication module 100A may not necessarily include the LC series resonant circuit 300.

The capacitance elements C3 and C4 and the inductor L3 (first inductor) form a pi (π) LPF 310A. Specifically, the capacitance elements C3 and C4 are shunt connected to a signal path between the output terminal of the power amplifier 10 and the band switch 30, and the inductor L3 is connected in series with a signal path between the capacitance element C3 and the capacitance element C4. The filter circuit included in the matching network 20A is not limited to a pi (π)-shape filter, such as the LPF 310A, and may be, for example, an L-shape filter or a T-shape filter. Any other filter circuit such as a BPF or a high-pass filter (HPF) may be used.

The inductor L4 (second inductor) is connected in series with the capacitance element C4 (first capacitance element). That is, the inductor L4 has one end connected to one end of the capacitance element C4, and another end grounded. The capacitance element C4 and the inductor L4 form an LC series resonant circuit that is shunt connected to the signal path in a manner similar to that of the LC series resonant circuit 300 described above to short-circuit a harmonic of the transmission signal RFin.

The variable capacitance element Ccont1 (first variable capacitance element) is shunt connected to a signal path on the band switch 30 side between the power amplifier 10 and the band switch 30. That is, the variable capacitance element Ccont1 has one end connected to one end of the capacitance element C5, and another end grounded. In the communication module 100A, the variable capacitance element Ccont1 is a digitally tunable capacitor (DTC) having a tunable capacitance value. A DTC has a capacitance value that is tuned with, for example, 8 bits in accordance with the control signal to be supplied. In this embodiment, the variable capacitance element Ccont11 has a capacitance value that is controlled in accordance with the mode and band of the transmission signal RFin. For example, the capacitance value of the variable capacitance element Ccont1 is controlled to a relatively large value when the transmission signal RFin is a 2G signal, and the capacitance value of the variable capacitance element Ccont1 is controlled to a relatively small value when the transmission signal RFin is a 3G/4G signal. Furthermore, the capacitance value of the variable capacitance element Ccont1 is controlled to a relatively large value (first value) when the transmission signal RFin has a relatively low frequency (first frequency band), and the capacitance value of the variable capacitance element Ccont1 is controlled to a relatively small value (second value) when the transmission signal RFin has a relatively high frequency (second frequency band). In the communication module 100A, therefore, the capacitance value of the variable capacitance element Ccont1 included in the matching network 20A is controlled, which enables the output impedance of the power amplifier 10 to be adjusted in accordance with the mode and band of the transmission signal RFin. In this embodiment, the variable capacitance element Ccont1 is located on a chip 32A on which the band switch 30 is located. Thus, the capacitance value of the variable capacitance element Ccont1 is controlled in accordance with a control signal Scont supplied to the chip 32A.

The variable capacitance element Ccont1 is not connected directly to the output terminal of the power amplifier 10 (for example, when the power amplifier 10 is constituted by an HBT, the collector of the HBT). The term "not connected directly to" means that series-connected elements are present between the output terminal of the power amplifier 10 and the one end of the variable capacitance element Ccont1. For example, in this embodiment, the inductor L3 and the capacitance element C5 are connected in series between the output terminal of the power amplifier 10 and the one end of the variable capacitance element Ccont1.

It is assumed here that a variable capacitance element is connected directly to the output terminal of a power amplifier. In this case, the variable capacitance element is inserted in a relatively low impedance area. A typical variable capacitance element has a lower Q-value and greater insertion loss than a typical capacitance element. Thus, a direct connection of a variable capacitance element to the output terminal of a power amplifier may cause deterioration in power-added efficiency or reduction in output power due to the insertion loss of the variable capacitance element. In this embodiment, in contrast, the variable capacitance element Ccont1 is not connected directly to the output terminal of the power amplifier 10. That is, the variable capacitance element Ccont1 is inserted in an area with higher impedance (about several tens of ohms (Ω)) than the impedance (for example, several ohms (Ω)) near the output terminal of the power amplifier 10. In the communication module 100A, therefore, the insertion loss of the variable capacitance element Ccont1 is lower than that of a variable capacitance element that is connected directly to the output terminal of a power amplifier, and the deterioration in power-added efficiency and the reduction in output power can be suppressed.

With the configuration described above, the communication module 100A can adjust the output impedance of the power amplifier 10 in accordance with the mode and band of the transmission signal RFin by controlling the capacitance value of the variable capacitance element Ccont1 included in the matching network 20A. Thus, it is possible to support different modes and bands using a single power amplifier without using individual power amplifiers suitable for the different modes and bands. Therefore, the increase in circuit scale can be suppressed compared to a configuration including a plurality of power amplifiers.

In the communication module 100A, the variable capacitance element Ccont1 is not connected directly to the output terminal of the power amplifier 10. Thus, the insertion loss of the variable capacitance element Ccont1 is lower than that of a variable capacitance element that is connected directly to the output terminal of a power amplifier, and the deterioration in power-added efficiency and the reduction in output power can be suppressed.

In this embodiment, furthermore, the variable capacitance element Ccont1 is located on the chip 32A on which the band switch 30 is located. Thus, a control signal Scont used for the switching operation of the band switch 30 can also be used to control the capacitance value of the variable capacitance element Ccont1. Accordingly, the design change from a configuration that does not include the variable capacitance element Ccont1 is easily achieved.

The matching network 20A may not necessarily include a single variable capacitance element. For example, the matching network 20A may include, instead of the variable capacitance element Ccont1, two variable capacitance elements that are connected in parallel. The configuration in which the two variable capacitance elements are included exhibits reduced lower combined resistance of the variable capacitance elements compared to a configuration in which a single variable capacitance element is included, and can thus be less affected by insertion loss.

Figure 4:
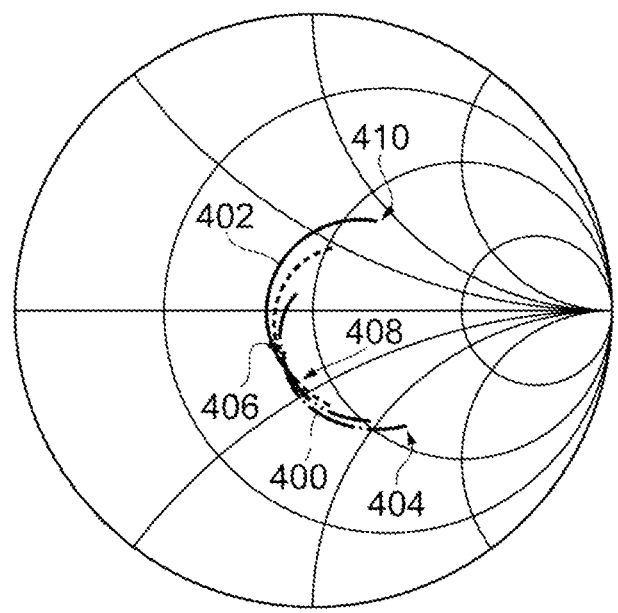
FIG. 4 illustrates output impedance loci of the power amplifier in the communication module according to the first embodiment of the present disclosure.

FIG. 4 illustrates output impedance loci of a power amplifier in a communication module according to the first embodiment of the present disclosure. In FIG. 4, output impedance loci of the power amplifier 10 in the communication module 100A when the capacitance value of the variable capacitance element Ccont1 included in the matching network 20A is controlled in four ways are illustrated. In the obtaining of the loci, as in the example illustrated in FIGS. 2A and 2B, no consideration is given to the influence of the constituent elements subsequent to the matching network 20A. The loci illustrated in FIG. 4 are normalized to the desired output impedance of the power amplifier 10 when the frequency of the transmission signal is changed from 699 MHz to 915 MHz (from a point 404 to a point 406 or from a point 408 to a point 410).

As illustrated in FIG. 4, the output impedance of the power amplifier 10 has variations from a locus 400 to a locus 402 in accordance with the capacitance value of the variable capacitance element Ccont1. Specifically, as the capacitance value of the variable capacitance element Ccont1 increases, the output impedance of the power amplifier 10 varies from the locus 400 to the locus 402. Thus, the capacitance value of the variable capacitance element Ccont1 is adjusted such that, for example, the locus 400 is obtained when the transmission signal is a low band signal and the locus 402 is obtained when the transmission signal is a very low band signal, which enables the output impedance to make it close to the target values for both bands. That is, it is found that in the communication module 100A, a single power amplifier can operate with the desired characteristics for signals of a plurality of bands.

Figure 5:
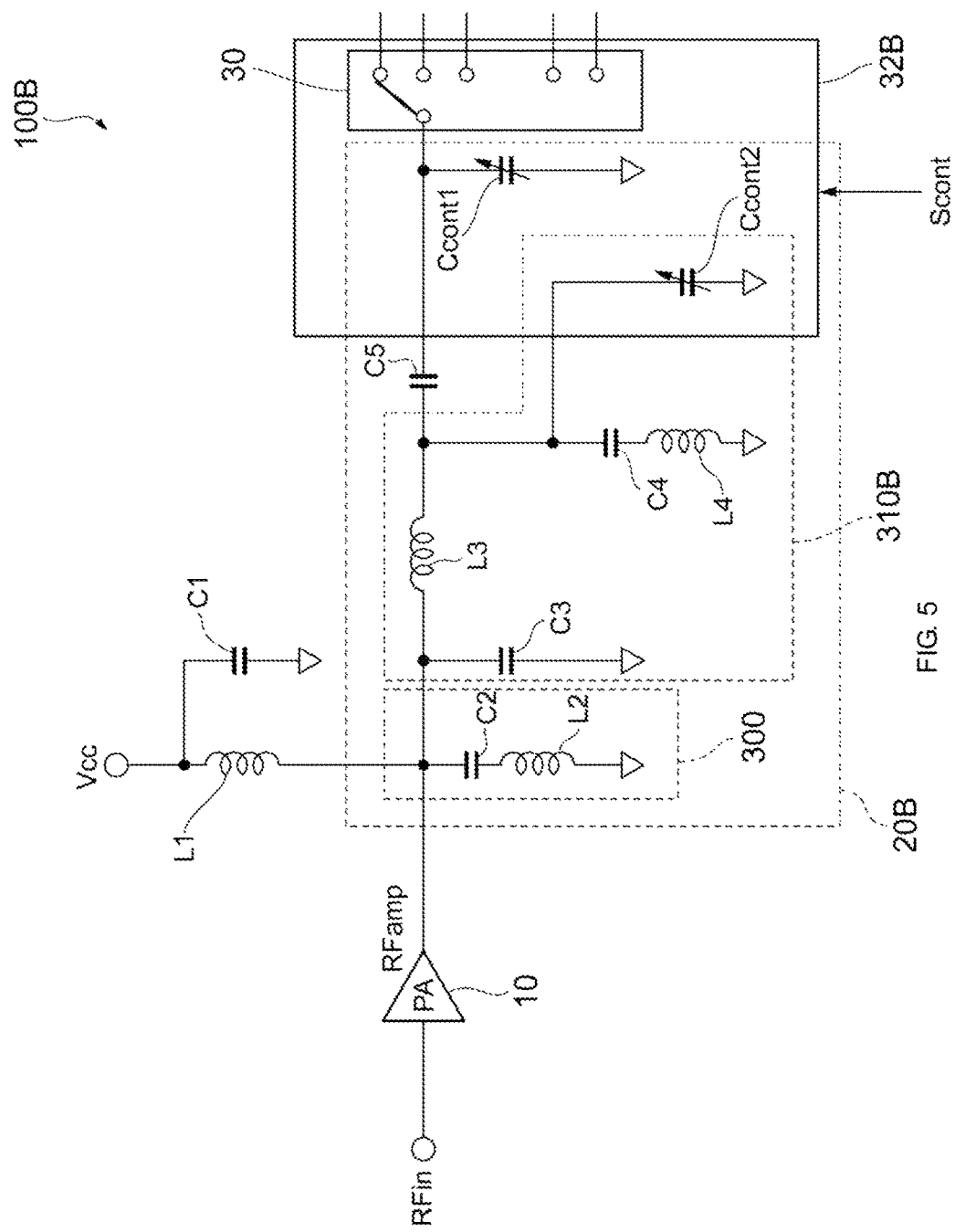
FIG. 5 illustrates an example configuration of a matching network in a communication module according to a second embodiment of the present disclosure.

FIG. 5 illustrates an example configuration of a matching network in a communication module according to a second embodiment of the present disclosure. The same or substantially the same elements as those of the communication module 100A are identified with the same numerals and are not described. In the second and subsequent embodiments, features common to the embodiment described above and the second and subsequent embodiments are not described and only the differences will be described. In particular, similar advantageous effects achieved using similar configurations will not be repeatedly described in the individual embodiments.

A matching network 20B illustrated in FIG. 5 is different from the matching network 20A illustrated in FIG. 3 in that the matching network 20B includes an LPF having a different configuration. Specifically, an LPF 310B further includes a variable capacitance element Ccont2.

The variable capacitance element Ccont2 is shunt connected to a signal path between the power amplifier 10 and the band switch 30 in a manner similar to that of the variable capacitance element Ccont1. In a communication module 100B including two variable capacitance elements in the manner described above, an adjustable-impedance area is larger than that in the communication module 100A.

Also, in this embodiment, as in the communication module 100A, the variable capacitance element Ccont2 is not connected directly to the output terminal of the power amplifier 10. That is, the inductor L3 is connected in series between the output terminal of the power amplifier 10 and one end of the variable capacitance element Ccont2. Thus, the insertion loss of the variable capacitance element Ccont2 is lower than that of a variable capacitance element that is connected directly to the output terminal of a power amplifier, and the deterioration in power-added efficiency and the reduction in output power can be suppressed.

In addition, similarly to the variable capacitance element Ccont1, the variable capacitance element Ccont2 is located on a chip 32B on which the band switch 30 is located. Thus, a control signal Scont used for the switching operation of the band switch 30 can also be used to control the capacitance values of the variable capacitance elements Ccont1 and Ccont2. Accordingly, the design change from a configuration that does not include the variable capacitance element Ccont1 or Ccont2 is easily achieved.

Figure 6:
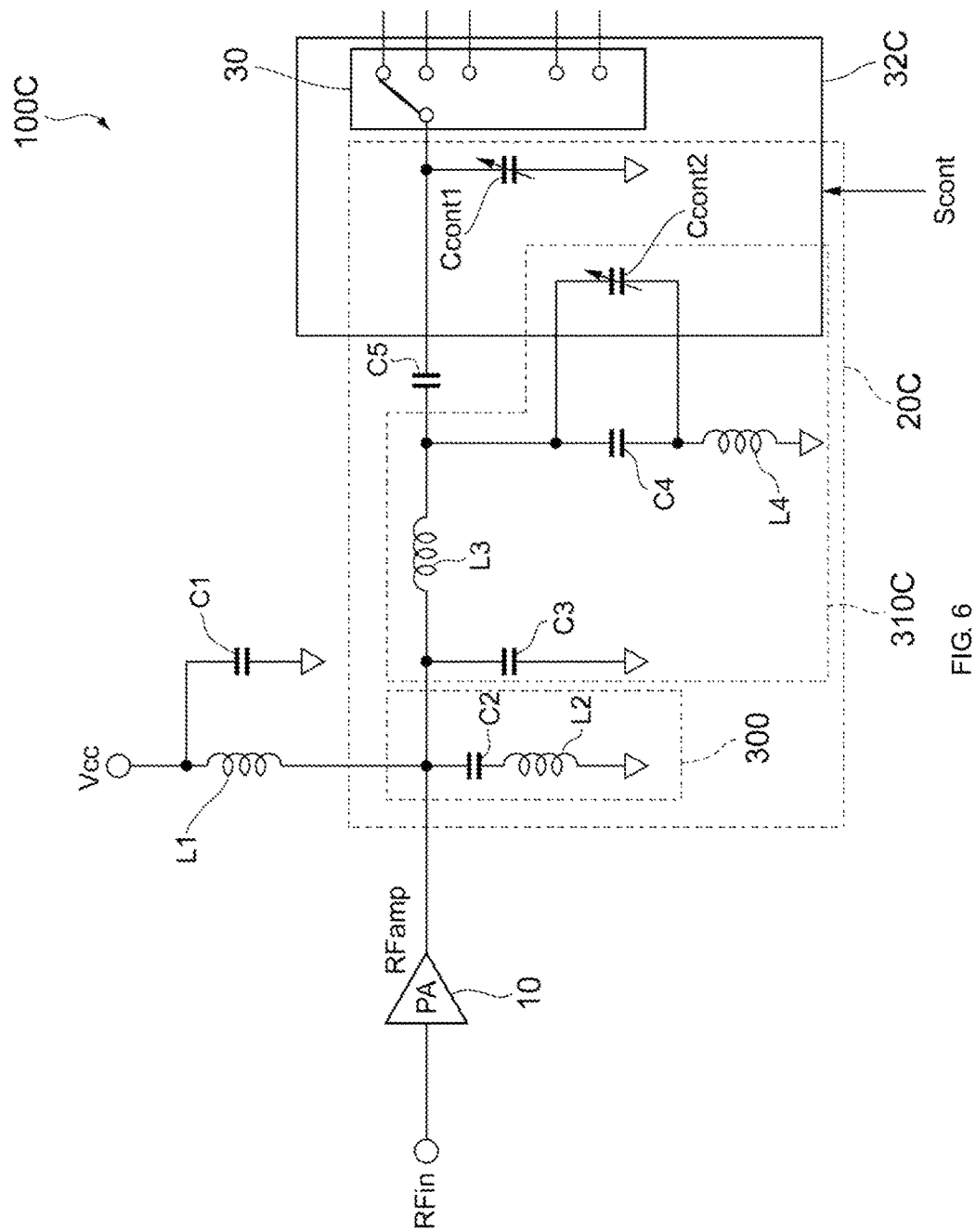
FIG. 6 illustrates an example configuration of a matching network in a communication module according to a third embodiment of the present disclosure.

FIG. 6 illustrates an example configuration of a matching network in a communication module according to a third embodiment of the present disclosure. The same or substantially the same elements as those of the communication module 100B are identified with the same numerals and are not described.

A matching network 20C illustrated in FIG. 6 is different from the matching network 20B illustrated in FIG. 5 in that the matching network 20C includes an LPF having a different configuration. Specifically, in an LPF 310C, the variable capacitance element Ccont2 (second variable capacitance element) is connected in parallel to the capacitance element C4. As described above, the variable capacitance element Ccont2, which is located on a chip 32C, may have an end connected to the other end of the capacitance element C4, and another end connected to a ground terminal of the chip 32C (see FIG. 5) or connected to an element external to the chip 32C (see FIG. 6). Thus, the resonant frequency of an LC series resonant circuit formed by the capacitance element C4 and the inductor L4 can be adjusted. Specifically, for example, the resonant frequency is decreased by increasing the capacitance value of the variable capacitance element Ccont2, and the resonant frequency is increased by decreasing the capacitance value of the variable capacitance element Ccont2. Accordingly, a communication module 100C can adjust attenuation poles in harmonics of the transmission signal RFin in addition to adjusting the output impedance of the power amplifier 10.

Figure 7:
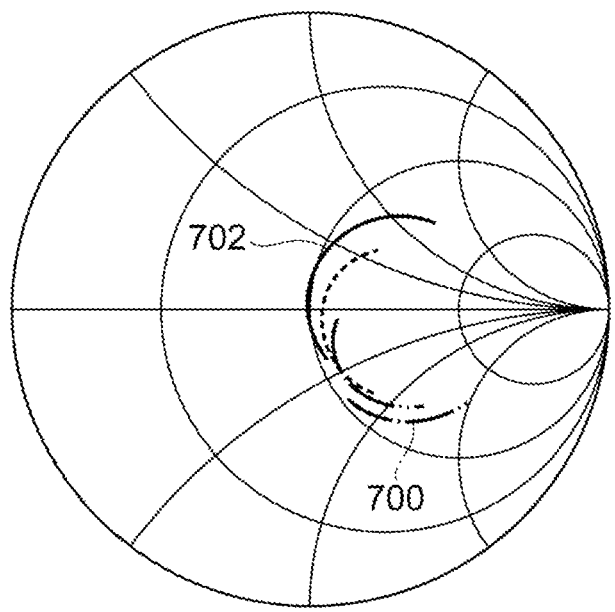
FIG. 7 illustrates output impedance loci of a power amplifier in the communication module according to the third embodiment of the present disclosure.

FIG. 7 illustrates output impedance loci of a power amplifier in a communication module according to the third embodiment of the present disclosure. In FIG. 7, output impedance loci of the power amplifier 10 in the communication module 100C when the capacitance values of the variable capacitance elements Ccont1 and Ccont2 included in the matching network 20C are controlled in four ways are illustrated. In the obtaining of the loci, as in the example illustrated in FIG. 4, no consideration is given to the influence of the constituent elements subsequent to the matching network 20C. The loci illustrated in FIG. 7 are normalized to the desired output impedance of the power amplifier 10 when the frequency of a transmission signal is changed from 699 MHz to 915 MHz.

As illustrated in FIG. 7, the output impedance of the power amplifier 10 has variations from a locus 700 to a locus 702 in accordance with the capacitance values of the variable capacitance elements Ccont1 and Ccont2. That is, it is found that in the communication module 100C, a single power amplifier can operate with the desired characteristics for signals of a plurality of bands.

Figure 8:
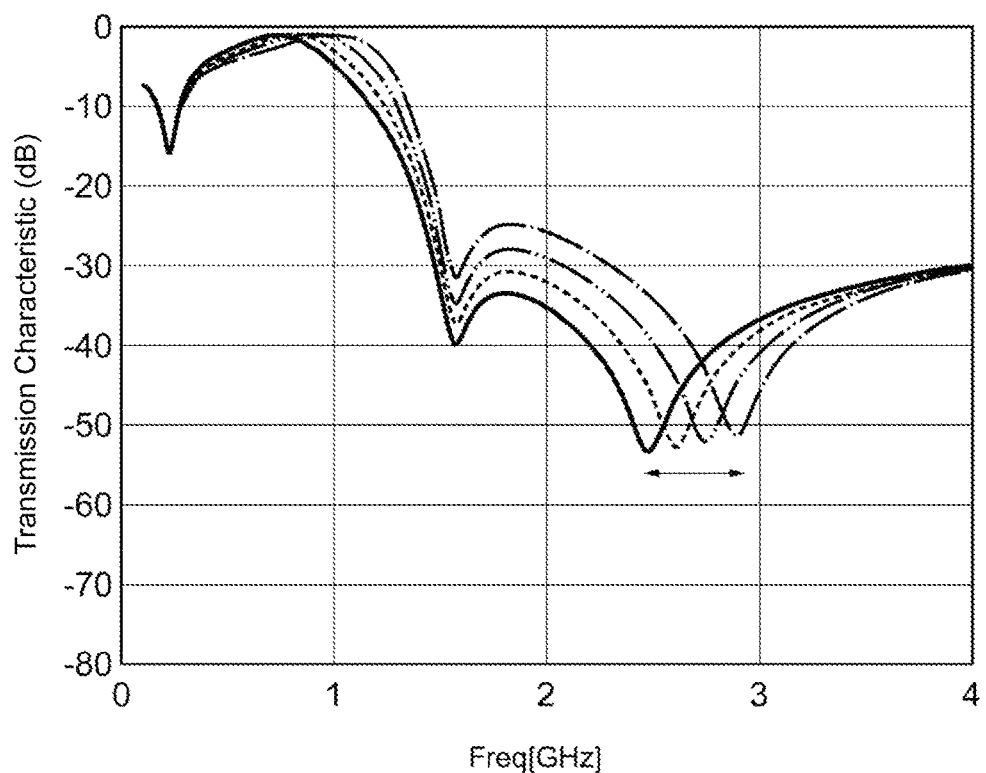
FIG. 8 is a graph illustrating an example of simulation results of bandpass characteristics of the communication module according to the third embodiment of the present disclosure.

FIG. 8 is a graph illustrating an example of simulation results of bandpass characteristics of a communication module according to the third embodiment of the present disclosure. The graph depicts a bandpass characteristic from the power amplifier 10 to the band switch 30 when the capacitance values of the variable capacitance elements Ccont1 and Ccont2 are controlled in four ways as in FIG. 7, with the y-axis representing bandpass characteristics (db) and the x-axis representing the frequencies (GHz) of the transmission signal RFin.

As illustrated in FIG. 8, controlling the capacitance value of the variable capacitance element Ccont2 enables the attenuation pole of a signal at about the frequency of a harmonic (in the example illustrated in FIG. 8, the third harmonic) of the transmission signal to be adjusted in the range of about 2.5 GHz to about 2.9 GHz (see the arrow illustrated in FIG. 8). The graph shows that the attenuation pole can be adjusted by controlling the capacitance value of the variable capacitance element Ccont2.

Exemplary embodiments of the present disclosure have been described. In the communication modules 100A to 100C, each of the matching networks 20A to 20C includes the variable capacitance element Ccont1, and the capacitance value of the variable capacitance element Ccont1 is controlled in accordance with the mode of the transmission signal RFin. Thus, the output impedance of the power amplifier 10 can be adjusted in accordance with the mode of the transmission signal RFin. In the communication modules 100A to 100C, therefore, a single power amplifier 10 is used to support different modes, and the increase in circuit scale can be suppressed compared to a configuration including a plurality of power amplifiers.

In the communication modules 100A to 100C, furthermore, the capacitance value of the variable capacitance element Ccont1 is controlled in accordance with the band of the transmission signal RFin. Thus, the output impedance of the power amplifier 10 can be adjusted in accordance with the band of the transmission signal RFin. In the communication modules 100A to 100C, therefore, a single power amplifier 10 can be used to support different bands, and the increase in circuit scale can be suppressed compared to a configuration including a plurality of power amplifiers.

In the communication modules 100A to 100C, moreover, the variable capacitance element Ccont1 is shunt connected to a signal path between the power amplifier 10 and the band switch 30 and is not connected directly to the output terminal of the power amplifier 10. With this configuration, the insertion loss of a variable capacitance element is lower than that of a variable capacitance element that is connected directly to the output terminal of a power amplifier. Accordingly, the deterioration in power-added efficiency of a communication module and the reduction in output power can be suppressed.

In addition, each of the matching networks 20A to 20C includes the inductor L3, which is connected in series between the output terminal of the power amplifier 10 and the variable capacitance element Ccont1. With this configuration, the matching networks 20A to 20C are each configured such that the variable capacitance element Ccont1 is not connected directly to the output terminal of the power amplifier 10.

In the communication modules 100A to 100C, furthermore, the capacitance value of the variable capacitance element Ccont1 is controlled to a large value when the frequency of the transmission signal RFin is low, and is controlled to a small value when the frequency of the transmission signal RFin is high. With this configuration, the output impedance of the power amplifier 10 can be made closer to the target values even if the bands of transmission signals are different. Accordingly, a single power amplifier can operate with the desired characteristics for signals of a plurality of bands.

In the communication modules 100A to 100C, moreover, the variable capacitance element Ccont1 is a digitally tunable capacitor located on a chip on which the band switch 30 is located. With this configuration, a control signal Scont used for the switching operation of the band switch 30 can also be used to control the capacitance value of the variable capacitance element Ccont1. Accordingly, the design change from a configuration that does not include the variable capacitance element Ccont1 is easily achieved.

In addition, the matching network 20C includes the capacitance element C4 that is shunt connected to a signal path between the power amplifier 10 and the band switch 30, the inductor L4 connected in series with the capacitance element C4, and the variable capacitance element Ccont2 connected in parallel to the capacitance element C4. With this configuration, the resonant frequency of an LC series resonant circuit formed by the capacitance element C4 and the inductor L4 can be adjusted. Accordingly, the communication module 100C can adjust attenuation poles in harmonics of the transmission signal RFin in addition to adjusting the output impedance of the power amplifier 10.

In the communication module 100C, the variable capacitance element Ccont2 is a digitally tunable capacitor located on a chip on which the band switch 30 is located. With this configuration, a control signal Scont used for the switching operation of the band switch 30 can also be used to control the capacitance value of the variable capacitance element Ccont2. Accordingly, the design change from a configuration that does not include the variable capacitance element Ccont2 is easily achieved.

The configuration of the communication modules 100 and 100A to 100C is not limited in particular. For example, the duplexers 40a to 40c for the 3G/4G mode and the filter circuit 42d for the 2G mode may be subsequent to the band switch 30.

The embodiments described above are intended to help easily understand the present disclosure, and are not to be used to construe the present disclosure in a limiting fashion. Various modifications or improvements can be made to the present disclosure without departing from the gist of the present disclosure, and equivalents thereof are also included in the present disclosure. That is, the embodiments may be appropriately modified in design by those skilled in the art, and such modifications also fall within the scope of the present disclosure so long as the modifications include the features of the present disclosure. For example, the elements included in the embodiments described above and the arrangement, materials, conditions, shapes, sizes, and the like thereof are not limited to those described in the illustrated examples but can be modified as appropriate. Furthermore, the elements included in the embodiments can be combined as much as technically possible, and such combinations of elements also fall within the scope of the present disclosure so long as the combinations of elements include the features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A communication module comprising:
a power amplifier that amplifies a transmission signal for one of a plurality of communication systems and outputs an amplified signal to a common signal path;
a switch circuit that switches a connection of the common signal path between a first communication system signal path and a second communication system signal path in accordance with the communication system of the transmission signal; and
an impedance-matching network disposed between the power amplifier and the switch circuit, the impedance-matching network comprising a first variable capacitance element,
wherein the first variable capacitance element has a capacitance value that is configured to be adjusted in accordance with the communication system of the transmission signal,
wherein the capacitance value of the first variable capacitance element is configured to be adjusted to a first value when the transmission signal is in a first frequency band, and is configured to be adjusted to a second value when the transmission signal is in a second frequency band, and
wherein the second value is less than the first value, and the second frequency band is greater than the first frequency band.

2. The communication module according to claim 1, wherein the capacitance value of the first variable capacitance element is configured to be adjusted in accordance with a frequency band of the transmission signal.

3. The communication module according to claim 1, wherein the first variable capacitance element is shunt connected to the common signal path and is not connected directly to an output terminal of the power amplifier.

4. The communication module according to claim 3, wherein the impedance-matching network further comprises a first inductor connected in the common signal path between the output terminal of the power amplifier and the first variable capacitance element.

5. The communication module according to claim 1,
wherein the first variable capacitance element is located on a chip on which the switch circuit is located,
wherein the first variable capacitance element is a digitally tunable capacitor, and
wherein the switch circuit is configured to be switched in accordance with a control signal and the capacitance value of the first variable capacitance element is configured to be adjusted in accordance with the control signal.

6. The communication module according to claim 1, wherein the impedance-matching network further comprises:
a resonant circuit that is shunt connected to the common signal path and comprises a first capacitance element connected in series with a second inductor, and
a second variable capacitance element connected in parallel to the first capacitance element.

7. The communication module according to claim 6,
wherein the second variable capacitance element is located on a chip on which the switch circuit is located, and
wherein the second variable capacitance element is a digitally tunable capacitor, and
wherein the switch circuit is configured to be switched in accordance with a control signal and the capacitance value of the second variable capacitance element is configured to be adjusted in accordance with the control signal.

8. The communication module according to claim 1, further comprising:
a duplexer disposed in the first communication system signal path; and
a filter circuit disposed in the second communication system signal path,
wherein the first communication system signal path is for a transmission signal for a third-generation mode or a fourth-generation mode, and
wherein the second communication system signal path is for a transmission signal for a second-generation mode.

* * * * *